(12) United States Patent
Tamir et al.

(10) Patent No.: US 10,782,375 B2
(45) Date of Patent: Sep. 22, 2020

(54) MULTI-CONTRAST IMAGES FROM A MAGNETIC RESONANCE IMAGING SCAN

(71) Applicant: The Regents of the University of California, Oakland, CA (US)

(72) Inventors: Jonathan I. Tamir, Berkeley, CA (US); Shimon Michael Lustig, Moraga, CA (US)

(73) Assignee: The Regents of the University of California, Oakland, CA (US)

( * ) Notice: Subject to any disclaimer, the term of this patent is extended or adjusted under 35 U.S.C. 154(b) by 535 days.

(21) Appl. No.: 15/482,658

(22) Filed: Apr. 7, 2017

(65) Prior Publication Data
US 2018/0292494 A1     Oct. 11, 2018

(51) Int. Cl.
*G01R 33/56* (2006.01)
*G01R 33/50* (2006.01)
*G01R 33/561* (2006.01)
*G01R 33/48* (2006.01)

(52) U.S. Cl.
CPC ......... *G01R 33/5602* (2013.01); *G01R 33/50* (2013.01); *G01R 33/4822* (2013.01); *G01R 33/5617* (2013.01)

(58) Field of Classification Search
CPC .......................... G01R 33/5602; G01R 33/50; G01R 33/4822; G01R 33/5617
USPC ......................................... 324/309, 307, 306
See application file for complete search history.

(56) References Cited

U.S. PATENT DOCUMENTS

| 7,034,532 B1* | 4/2006 | Shenoy | G01R 33/5613 324/307 |
|---|---|---|---|
| 2017/0322276 A1* | 11/2017 | Bhat | G01R 33/4828 |
| 2018/0136300 A1* | 5/2018 | De Rochefort | G01R 33/54 |

OTHER PUBLICATIONS

Barral, et al., A robust methodology for In Vivo $T_1$ Mapping, Magnetic Resonance in Medicine, 2010, pp. 1057-1067, vol. 64.
Busse, et al., Effects of Refocusing Flip Angle Modulation and View Ordering in3D Fast Spin Echo, Magn Reson Med., Sep. 2008, pp. 640-649.
Mugler, Optimized three-dimensional fast-spin-echo MRI, Journal of Magnetic Resonance Imaging, 2014, pp. 745-767, vol. 39.
Tamir, et al., Generalized magnetic resonance image reconstruction using the Berkeley Advanced Reconstruction Toolbox, No Date, 1 page.

(Continued)

*Primary Examiner* — Farhana A Hoque
(74) *Attorney, Agent, or Firm* — Mintz Levin Cohn Ferris Glovsky and Popeo, P.C.

(57) ABSTRACT

In a volumetric fast spin-echo magnetic resonance imaging system a plurality of radio frequency pulses can be emitted. The plurality of radio frequency pulses can be directed toward a target sample. The plurality of radio frequency pulses can have a set of repetition times. The set of repetition times can define a frequency at which the plurality of radio frequency pulses are emitted. The set of repetition times can be varied during the emitting of the plurality of the radio frequency pulses. Magnetic resonance imaging data of a target sample can be received. A pseudo-random sampling pattern can be used to facilitate the receiving of the magnetic resonance imaging data having multiple magnetic resonance imaging contrasts for a single scan.

18 Claims, 13 Drawing Sheets

(56) References Cited

OTHER PUBLICATIONS

Trzasko, et al., Local versus global low-rank promotion in dynamic MRI series reconstruction, Proc. Intl. Soc. Mag. Reson. Med. 2011, p. 4371, vol. 19.

Uecker, et al., ESPIRiT—An eigenvalue approach to autocalibrating parallel MRI: where SENSE meets GRAPPA, Magnetic Resonance in Medicine, 2014, pp. 990-1001, vol. 71.

* cited by examiner

| | Multi Spin-Echo | Inversion Recovery Fast Spin-Echo | CUBE-T2 | CUBE-T1 | T1-T2 Shuffling |
|---|---|---|---|---|---|
| Acquisition Type | 2D interleaved | 2D interleaved | 3D non-selective | 3D non-selective | 3D non-selective |
| Readout Direction | Axial | Axial | Sagittal | Sagittal | Sagittal |
| TR (ms) | 3000 | 3000 | 3000 | 600 | 900, 1830, 2800 |
| TR Scan Time Fraction | - | - | - | - | 0.34, 0.4, 0.26 |
| TE (ms) | 13.2 – 422.4 | 9 | 97 | 13 | - |
| Inversion Time (ms) | - | 200, 400, 800, 1200 | - | - | - |
| Echo Spacing (ms) | 13.2 | 8.9 | 4.7 | 4.4 | 4.7 |
| Echo Train Length | 32 | 3 | 130 | 28 | 132 |
| Receive Bandwidth (kHz) | 33.3 | 64.5 | 62.5 | 62.5 | 62.5 |
| Field of View | $22 \times 17.5$ cm$^2$ | $22 \times 17.5$ cm$^2$ | $26 \times 23.4 \times 17.8$ cm$^3$ | $26 \times 23.4 \times 17.8$ cm$^3$ | $26 \times 23.4 \times 17.8$ cm$^3$ |
| Acquisition Voxel | $0.86 \times 0.86$ mm$^2$ | $0.86 \times 0.86$ mm$^2$ | $0.8 \times 0.8 \times 1.2$ mm$^3$ | $0.8 \times 0.8 \times 1.2$ mm$^3$ | $0.8 \times 0.8 \times 1.2$ mm$^3$ |
| Acquisition Matrix | $256 \times 204$ | $256 \times 204$ | $320 \times 288 \times 148$ | $320 \times 288 \times 148$ | $320 \times 288 \times 148$ |
| Slice Thickness (mm) | 5 | 5 | 1.2 | 1.2 | 1.2 |
| Partial Fourier fraction | - | - | - | - | 0.6 |
| Scan Time (min) | 10 | 14 | 4 | 3 | 7 |

FIG. 2

MULTI-CONTRAST IMAGES FROM A MAGNETIC RESONANCE IMAGING SCAN

STATEMENT REGARDING FEDERALLY SPONSORED RESEARCH OR DEVELOPMENT

This invention was made with government support under grant number EB009690 awarded by the National Institutes of Health. The government has certain rights in the invention.

TECHNICAL FIELD

The subject matter described herein relates to generating, from a single magnetic resonance imaging scan, magnetic resonance images with multiple contrasts.

BACKGROUND

Magnetic resonance imaging (MRI) is an imaging technique. MRI scanners use strong magnetic fields, radio waves, and field gradients to generate images. MRI scanners are typically used to obtain medical images of patients. MRI systems use properties of nuclear magnetic resonance (NMR) to obtain MRI images of a target sample. Some atomic nuclei can absorb and emit radio frequency energy when placed in an external magnetic field. MRI scanners typically target hydrogen atoms. The hydrogen atoms are manipulated by an MRI scanner to generate detectable radio frequency signals that can be received by antennas of the MRI scanner. Pulses of radio waves, generated by the MRI scanner, excite the nuclear spin energy transition of the atomic nuclei. A signal is emitted by the atomic nuclei when the nuclear spin energy of the atomic nuclei decay. Magnetic field gradients localize the signal generated by the nuclear spin energy transition of the atomic nuclei in space.

SUMMARY

In some aspects systems and methods are described for obtaining magnetic resonance images of a target sample. The methods can include one or more of the following operations. A plurality of radio frequency pulses can be emitted. The plurality of radio frequency pulses can be directed toward a target sample. The plurality of radio frequency pulses can have a set of repetition times. The set of repetition times can define a frequency at which the plurality of radio frequency pulses are emitted. The set of repetition times can be varied during the emitting of the plurality of the radio frequency pulses. Magnetic resonance imaging data of a target sample can be received. A pseudo-random sampling pattern can be used to facilitate the receiving of the magnetic resonance imaging data.

The systems can comprise a magnetic resonance imaging system. The system can comprise a transmitter configured to at least emit a plurality of radio frequency pulses directed toward a target sample. The plurality of radio frequency pulses can have a set of repetition times defining a frequency at which the plurality of radio frequency pulses are emitted. The system can comprise a controller. The controller can be configured to at least vary, during the emitting of the plurality of radio frequency pulses, the set of repetition times. Magnetic resonance imaging data of the target sample can be received. The magnetic resonance imaging data can be received by a receiver. The magnetic resonance imaging data can be received using a pseudo-random sampling pattern.

One or more of the following operations may be optionally performed. In some variations, the magnetic resonance imaging scan can be a volumetric fast spin-echo magnetic resonance imaging scan. The set of repetition times can be varied by having a specified set of lengths of the set of repetition times. A fraction of a total scan time of the magnetic resonance imaging scan can be specified for each of the repetition times. The varying, during an MRI scan, of the repetition times can follow the specified set of lengths. The order of the different repetition time lengths can also be specified. The repetition times can be pre-optimized based on a pattern of repetition times. The pattern can be associated with one or more attributes of the target sample. In some variations, the repetition times can be pseudo-randomly varied. The plurality of magnetic resonance images can be obtained from a single magnetic resonance imaging scan. In some variations, the set of specified contrasts include at least two contrasts.

An ensemble of signal evolutions for one or more voxels of the magnetic resonance imaging data can be simulated. The simulating can be performed by one or more processors executing instructions stored in memory, which when executed cause the one or more processors to perform the simulating. The simulating can be performed for each repetition time of the repetition times. The simulating of the ensemble of signal evolutions for the one or more voxels can include simulating, for one or more repetition times of the set of repetition times, the ensemble of signal evolutions for a set of radio frequency refocusing pulses. A linear combination of the magnetic resonance imaging data can be generated for a set of specified contrasts. The linear combinations can enable generation of a plurality of magnetic resonance images. The generating can be performed by one or more processors executing instructions stored in memory, which when executed cause the one or more processors to perform the generating.

The methods can include one or more of the following operations. A plurality of radio frequency pulses can be emitted. The plurality of radio frequency pulses can be directed toward a target sample. An inversion radio frequency pulse can be emitted. The inversion radio frequency pulse can be configured to cause an inversion of a magnetization of the target sample. A radio frequency excitation pulse and a radio frequency refocusing pulse can be emitted. The radio frequency excitation pulse and radio frequency refocusing pulse can be emitted after an inversion time. The inversion time can be varied. The inversion time can be varied during the emitting of the plurality of radio frequency pulses. The inversion times can be varied using one or more of the techniques described with respect to varying the repetition times. A pseudo-random sampling pattern can be used to facilitate receipt of magnetic resonance imaging data of the target sample.

The systems can comprise a transmitter configured to at least emit a plurality of radio frequency pulses. The radio frequency pulses can include at least an inversion radio frequency pulse. The inversion radio frequency pulse can be configured to cause an inversion of a magnetization of the target sample. The inversion radio frequency pulse can be emitted by a transmitter. A radio frequency excitation pulse and a radio frequency refocusing pulse can be emitted after an inversion time. The system can comprise a controller configured to at least vary the inversion time. The inversion time can be varied during the emitting of the plurality of radio frequency pulses. The system can include a receiver configured to at least receive magnetic resonance imaging data of the target sample. The magnetic resonance imaging data can be received using a pseudo-random sampling pattern.

One or more of the following operations may be optionally performed. A set of repetition times of the radio frequency pulses can be varied. The repetition times can be varied in a similar manner to the inversion times. For example, the repetition times can be varied pseudo-randomly, in accordance with a fixed pattern, or the like. The inversion times can be varied by a controller.

Implementations of the current subject matter can include, but are not limited to, methods consistent with the descriptions provided herein as well as articles that comprise a tangibly embodied machine-readable medium operable to cause one or more machines (e.g., computers, MRI scanning systems, or the like) to result in operations implementing one or more of the described features. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected with each other and/or a MRI scanning system(s), and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, and/or the MRI scanning system(s), or the like.

The details of one or more variations of the subject matter described herein are set forth in the accompanying drawings and the description below. Other features and advantages of the subject matter described herein will be apparent from the description and drawings, and from the claims. It should be readily understood that the features described herein are not intended to be limiting and are for illustrative purposes only. The claims that follow this disclosure are intended to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 2 shows a table of MRI scanning and imaging parameters for use with an MRI system having one or more features consistent with the present description;

When practical, similar reference numbers denote similar structures, features, or elements.

DETAILED DESCRIPTION

Figure 1:
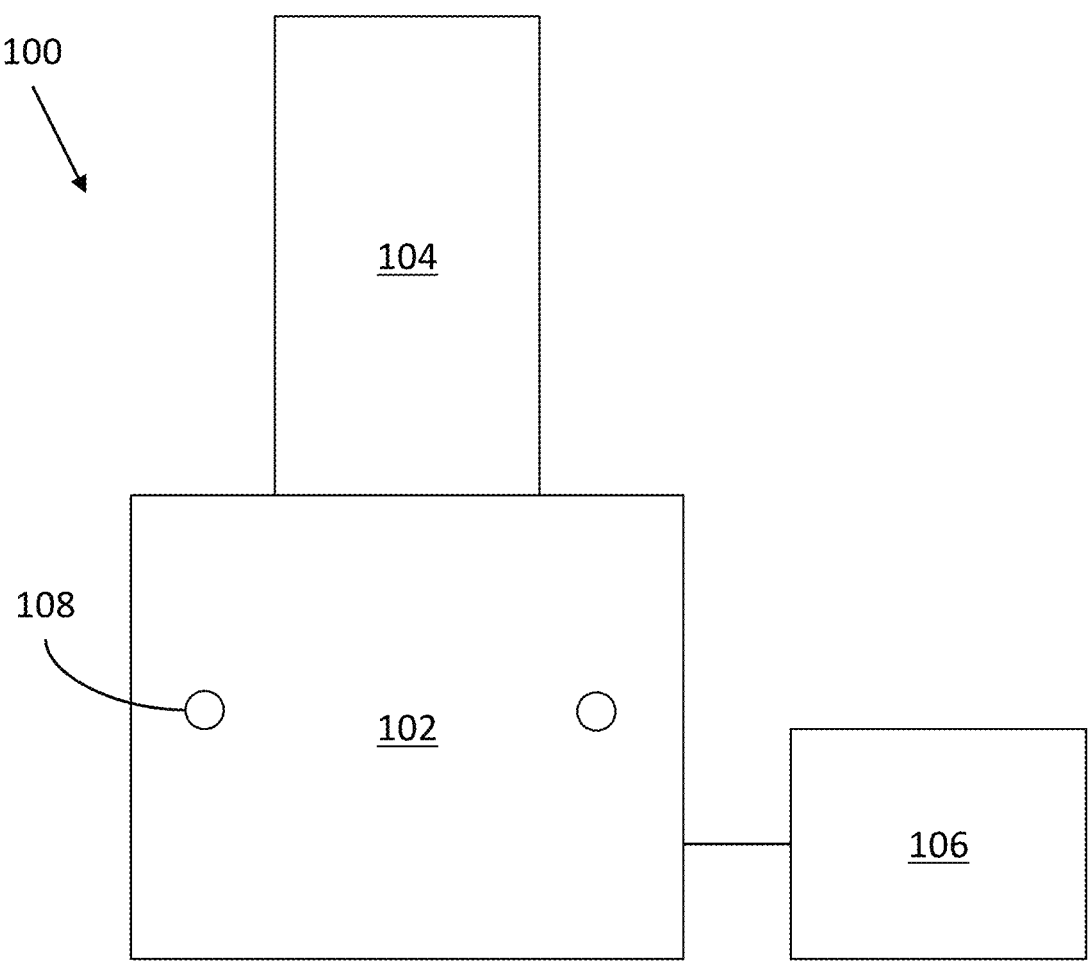
FIG. 1 is a schematic illustration of a magnetic resonance imaging (MRI) system having one or more features consistent with the present description.

Conventional volumetric fast spin-echo (3D FSE) magnetic resonance imaging (MRI) protocols require multiple separate MRI scans to obtain magnetic resonance (MR) images having multiple MRI contrasts. A magnetic resonance imaging (MRI) scanning protocol is described herein that can flexibly reconstruct, from a single MRI scan, magnetic resonance (MR) images having different MR contrasts. The MRI scanning protocol can be a volumetric fast spin-echo (3D FSE) MRI scanning protocol, although other types of protocols may be used as well.

MR images having multiple proton-density, T1-weighted, and T2-weighted image contrasts, or the like, can be obtained for example from a single volumetric fast spin-echo MRI scan. The presently described MRI scanning protocol can include various preparation sequences and modules, including one or more of two-point and multi-point Dixon-based water-fat separation, reduced field-of-view imaging, fat suppression, partial Fourier acquisition, inversion recovery module, and the like.

An MRI scanning protocol includes an acquisition phase and a reconstruction phase. During the acquisition phase, MRI data is obtained of the target sample. During the reconstruction phase, the MRI data is synthesized into usable MRI images of the target sample. A target sample can be any sample that is scanned by an MRI system. An example of a target sample can include tissue of a human, animal, or the like.

Volumetric fast spin-echo (3D FSE) magnetic resonance imaging (MRI) is robust to the effects of off-resonance pulses (off-resonance pulses have a magnetic field that is not exactly at the Larmor frequency for a given atomic nuclei). And, volumetric fast spin-echo (3D FSE) MRI can provide MR images with multiple types of MR image contrasts. Fast spin-echo MR imaging is similar to conventional spin-echo sequences, but the phase-encoding gradient for each echo is changed. As a result of changing the phase-encoding gradient between echoes, multiple lines of k-space (e.g., phase-encoding steps) can be acquired within a given repetition time (TR) of the MRI scan. Due to multiple phase-encoding lines being acquired during each repetition time (TR) interval, fast spin-echo techniques can significantly reduce imaging time. Volumetric, or three-dimensional (3D) MRI scanning involves exciting atomic nuclei in volume of a target sample, compared to two-dimensional (2D) MRI scanning which excites atomic nuclei in just a plane of the target sample.

To maintain scan efficiency in volumetric fast spin-echo MR imaging, long echo trains (series of radio frequency refocusing pulses and their corresponding echoes for a volumetric fast spin-echo pulse sequence) can be used. Long echo trains can result in blurring of the resultant MR images. The blurring is caused by the decaying excited nuclei generating signals during the echo train time period which are detected by the MRI system. This blurring can preclude volumetric fast spin-echo MRI scanning from being used to obtain MR images of target samples, such as target tissues, having short decay times, for example, the musculoskeletal structure. Furthermore, using the presently described MRI scanning protocol, only a single MR image contrast is obtained for each scan of a patient, requiring multiple repeated scans and long exam times for patients when multiple MR image contrasts are desired.

The presently described subject matter is directed to obtaining multiple image contrasts from a single volumetric fast spin-echo MRI scan. In some example embodiments, multiple MRI contrast images can be obtained, from a single MRI scan, by varying MRI repetition times (TRs) and/or MRI inversion times during the emission, by an MRI scanning system, of radio frequency pulses. The MRI data can be obtained, by the MRI scanning system, using pseudo-random sampling patterns. The obtained volumetric MRI data can be synthesized into multiple image contrasts representing arbitrary scan parameters. Consequently, the presently described subject matter reduces the blurring caused by target samples having nuclei with short excitation decay rates, as well as reduces the scanning time ordinarily required to obtain multiple MR image contrasts.

The MR image contrasts can include one or more of proton-density, T1-weighted, T2-weighted, or the like. In some variations, quantitative T1 and T2 parameter maps can be estimated from the MRI acquisition data. T1 reflects the amount of time taken for a target sample's atomic nuclei spin to realign with the main magnetic field generated by the MRI system. T2 reflects the amount of time taken for a target sample's atomic nuclei spin, in the transverse plane, to decay.

FIG. 1 is a schematic illustration of a magnetic resonance imaging (MRI) system 100 having one or more features consistent with the present description.

The MRI system 100 can comprise a magnet system 102, a target sample transport table 104, a controller 106 and/or one or more other components. The controller 106 can be operatively connected to the magnet system 102 and/or the target sample transport system 104. The controller can include a processor, a timer, a memory storing instructions which when executed by a processor cause the processor to perform one or more operations, or the like. In some variations, the controller can be at least part of the computing system 800 illustrated in FIG. 8. In some variations, the controller can have one or more components of the computer system 800 illustrated in FIG. 8. A target sample can be placed on the target sample transport table 104. The target sample on the target sample transport table 104 can move relative to the magnet system 102. The controller 106 can be configured to facilitate control of magnetic fields and/or radio frequency signals generated by the magnet system 102. The magnetic fields and/or radio frequency signals generated by the magnet system 102 can be configured to excite atomic nuclei within the target sample. The controller 106 can be configured to receive signals from one or more detectors 108 that are configured to detect radio frequency signals generated by nuclei of the target sample as the excitation state of the nuclei decay.

In some variations, the one or more detectors 108 can be included in the "antenna" of the MRI system 100. In some variations, the antenna of the MRI system 100 can comprise one or more components configured to broadcast radio frequency signals and/or receive radio frequency signals. In other variations, the one or more detectors 108 can be configured to receive radio frequency signals only. The signals described in the present disclosure, with respect to MRI imaging, are radio frequency signals received by the one or more detectors 108. These signals represent different parameters of the target sample being MR imaged. The detectors 108 can include a transmitter, receiver, and/or transceiver. In some variations, the transmitter can be just an antenna or alternatively or additionally, antenna and RF circuitry (e.g., power amplifiers, switches, and the like) to generate the signal, or the like. In some variations, the receiver can be an antenna or alternatively or additionally, antenna and RF circuitry (e.g., power amplifiers, switches, and the like) to generate the signal, or the like. In some variations, the transmitters and receivers can be located at the same location and/or be the same device. In some variations, the transmitters and receivers can be located at different locations. The transmitter, receiver and/or transceiver, can include one or more of a horn, a waveguide, an antenna, or the like.

MRI system 100 may perform a volumetric fast spin-echo magnetic resonance imaging scan. In the example of FIG. 1, the MRI system's pulse sequence delay times can be computed. The pulse sequence delay times can be computed based on an MRI technician's experience or through calibration using a control device, for example, control device 106. During an MRI scan, pulses of radio waves, generated by the MRI system 100, can excite the nuclear spin energy transition of atomic nuclei. The atomic nuclei that are targeted by MRI scanners may be hydrogen atom nuclei. Magnetic field gradients can localize the signals generated by the nuclear spin energy transition of the atomic nuclei in space. Varying the parameters of the pulse sequence of the pulses of radio waves can provide different contrasts between target samples based on the relaxation properties of the atomic nuclei in the target sample.

MR image contrasts can be weighted by modifying one or more parameters of the radio waves generated by the magnet system 102 and/or one or more operational parameters of the magnets of the magnet system 102. Once excited, the nuclei in a target sample can return to their equilibrium state by independent processes called spin-lattice relaxation (T1) and spin-spin relaxation (T2). Spin-lattice relaxation is characterized by the spin-lattice relaxation time, $T_1$, and spin-spin relaxation is characterized by the spin-spin relaxation time, $T_2$. T1-weighted images can be generated by allowing magnetization to partially recover before measuring the magnetic resonance (MR) signal. Magnetization can be allowed to partially recover by changing the MRI repetition time (TR). T2-weighted images can be generated by allowing the magnetization to decay before measuring the MR signal. Magnetization can be allowed to decay by changing the MRI echo time (TE).

An operator of the MRI system 100 can set various parameters, for the MRI scan, to obtain a target image contrast and a target scan time. An operator can be a person, a processor, and/or the like, controlling the MRI system 100. The MRI system 100 can be a volumetric fast spin-echo MRI system. Parameters that affect a target image contrast can include MRI repetition time (TR), MRI echo time (TE), MRI radio frequency pulse amplitudes, echo train length (ETL), and the like. Parameters that affect a target scan time can include image resolution, spatial acceleration factor, echo train length (ETL), MRI repetition time (TR), and the like.

MRI repetition time (TR) is the time between the application of a first radio frequency excitation pulse to the application of a second radio frequency excitation pulse. MRI echo time (TE) is the time between the application of a radio frequency excitation pulse and the peak of the signal induced in the detector 108 by the spin energy decay of the nuclei in the target sample. For volumetric fast spin-echo, MRI echo time (TE) corresponds to the echo spacing between the application of successive radio frequency refocusing pulses. The MRI parallel imaging acceleration factor determines the number of MRI samples to be acquired, and thus the rapidity of the pulse sequences. The MRI echo train length (ETL) limits the number of echoes that are to be acquired following a single radio frequency excitation pulse and combined into a single MR image or image set in multiple echo imaging sequences or echo-train techniques. In multiple echo imaging techniques, more than one echo is acquired per excitation pulse of the magnet system 102.

In some variations, during acquisition of an MRI scan, the controller 106 can be configured to cause the order of the echo train sampling to be randomly shuffled. The echo train sampling can be randomly shuffled in accordance with one or more sampling masks applied to the data associated with the MRI scan. Shuffling the echo train sampling includes traversing k-space in a random fashion, and repeatedly resampling phase encodes. Conversely, standard echo train sampling includes a center-out ordering approach, a left-to-right ordering approach, or the like. Shuffling of the echo train sampling can reduce image blur. However, shuffling of the echo train sampling can introduce noise-like artifacts into the raw MR image data. The artifacts can be iteratively suppressed in a regularized reconstruction based on compressed sensing resulting in the recovery of signal dynamics at any virtual echo time during the echo train.

Due to echo train shuffling allowing for the recovery of the signal dynamics at any virtual echo time during the echo train, the echo time (TE) need not be set by an operator of the MRI system 100. Instead of specifying an echo time (TE), an operator of the MRI system 100 can specify a target resolution, MRI repetition time (TR), MRI echo train length (ETL), and MRI parallel imaging acceleration factor. MRI scan data can be independently collected at each echo time (TE) during each echo train. The MRI repetition time (TR) and the scan time can provide an upper limit on the number of echo trains, independent of specifying an echo time (TE) or echo train length (ETL). In some variations, the echo train shuffling and compressed sensing-based iterative reconstruction can be referred to as T2 Shuffling and can provide varying levels of T2 sensitivity to the obtained MR images.

In some variations, the MRI repetition time (TR) can be specified independently for each MRI radio frequency excitation pulse and echo train. This can provide T1 sensitivity to the obtained MR images. Sampling patterns can be prescribed for each combination of MRI echo time and MRI repetition time.

In some variations, an inversion recovery pulse sequence can be used to generate MRI images having multiple contrasts from a single MRI scan of a volumetric fast spin-echo MRI scanner. Inversion recovery is a spin-echo sequence preceded by a 180° inversion pulse. The time between the inversion pulse and the 90° excitation pulse of a spin-echo sequence is called the inversion time. Using an inversion recovery pulse sequence to generate MRI images having multiple contrasts, from a single MRI scan of a volumetric fast spin-echo MRI scanner, can include modifying the inversion time.

The main MRI scan prescription can be similar to conventional volumetric fast spin-echo MRI scans, for example, resolution, matrix size and field of view can be maintained. However, a parallel imaging acceleration factor need not be specified. Instead, a maximum scan time can be prescribed that limits the number and lengths of the MRI repetition times (TRs). The echo train length (ETL) and/or set of unique MRI repetition times (TRs) and order of MRI repetition times (TRs) can be supplied by an operator of the MRI system 100 and/or selected based on a particular MRI protocol's pre-optimized values. Further, for each MRI repetition time (TR), a corresponding fraction of the total scan time can be supplied. As an example, a volumetric fast spin-echo pulse sequence, which uses radio frequency refocusing pulses with varying flip angles, can be modified to facilitate the independent specification of MRI repetition times (TRs). The volumetric fast spin-echo pulse sequence can additionally be modified to re-sample phase encodes at different echo times, allowing independent specification of MRI echo times (TEs) for each acquired phase encode sample. Sampling patterns can be prescribed to each unique combination of MRI repetition time and MRI echo time. The sampling patterns can include, for example, Poisson-disk sampling patterns, variable density pseudo-random sampling patterns, center-out sampling patterns, or the like.

FIG. 2 shows a table 200 having a column 202 of MRI scanning and imaging parameters for use with an MRI system having one or more features consistent with the present description. The scanning and imaging parameters shown in table 200 are exemplary only. Column 204 describes MRI scanning and imaging parameters for a conventional quantitative T2 sequence, column 206 describes MRI scanning and imaging parameters for a conventional quantitative T1 sequence, columns 208 and 210 describe scanning and imaging parameters for conventional fast spin-echo sequence with two different parameter sets, one for T2-weighted (column 208) and one for T1-weighted (column 210). The scans generated using the scanning and imaging parameters in columns 208 and 210 each produce a volumetric MRI image set having a single MRI contrast. Conversely, using the presently described volumetric fast spin-echo protocol, using, for example, the scanning and imaging parameters shown in column 202, volumetric MRI images having arbitrary MRI contrasts can be generated from a single volumetric fast spin-echo MRI scan.

The total number of echo trains for an MRI scan, where the MRI scan is a volumetric fast spin-echo MRI scan, with a specified MRI repetition time (TR) for each echo train can be given by:

$$N_j = \frac{\text{Scan Time} \times p_j}{TR_j},$$

where $TR_j$, $p_j$, and $N_j$ are the MRI repetition time, fraction of scan time, and number of echo trains for the $j^{th}$ unique MRI repetition time segment, respectively. The total scan time is, therefore, provided by:

$$\text{Scan Time} = \sum_{j=1}^{R} TR_j N_j,$$

where R is the total number of unique MRI repetition time (TR) segments. In practice, shorter MRI repetition time may be allocated increased scan time to improve scan efficiency, this is due to more echo trains being able to be acquired when short MRI repetition times (TRs) are specified.

Figure 3:
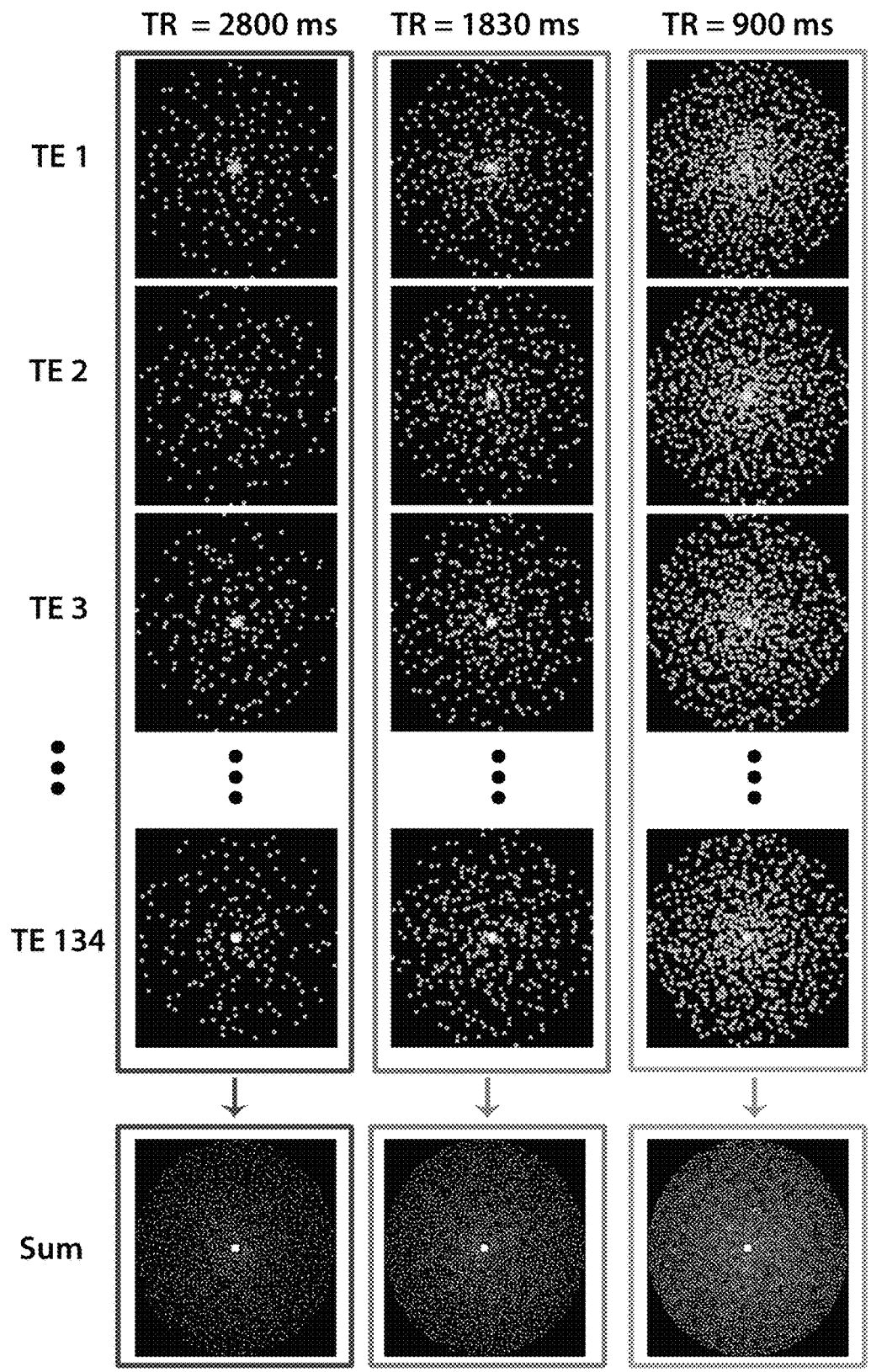
FIG. 3 shows variable density Poisson disk sampling patterns for a set of unique MRI echo time (TE) and MRI repetition time (TR) combinations for use in a process having one or more features consistent with the present description.

FIG. 3 shows variable density Poisson disk sampling patterns for a set of unique MRI echo time (TE) and MRI repetition time (TR) combinations for use in a process having one or more features consistent with the present description The summation of the patterns along the MRI echo time (TE) indicates that the fraction of scan time allocated is inversely proportional to MRI repetition time (TR). In some variations, the sampling pattern applied to the MRI echo train data and MRI repetition time data can be variable-density Poisson-disk sampling pattern, variable density pseudo-random sampling patterns, center-out sampling patterns, or the like. The sampling patterns can provide suitable coverage in k-space for each MRI repetition time (TR) segment and MRI echo time (TE). The k-space coverage can be provided in a manner that is compatible with both compressed sensing and parallel imaging, as the masks can include pseudo-random variable density sampling. In some variations, more samples can be allocated in the center of the mask, which facilitates compressed sensing. The distance between any two samples in the mask can be limited, which facilitates parallel imaging.

Subsequent to prescribing the sampling patterns to the MR image data, echo train views can be ordered for each MRI repetition time (TR) segment. The echo trains for each MRI repetition time (TR) segment can be played sequentially, interleaved, or pseudo-randomly throughout the scan data. This results in a set of under-sampled k-space data at each unique combination of MRI echo time (TE) and MRI repetition time (TR). k-space is an array of numbers that represent spatial frequencies in the magnetic resonance image obtained by an MRI system, such as MRI system 100. k-space can be defined as the Fourier Transform of a magnetic resonance image.

Figure 4:
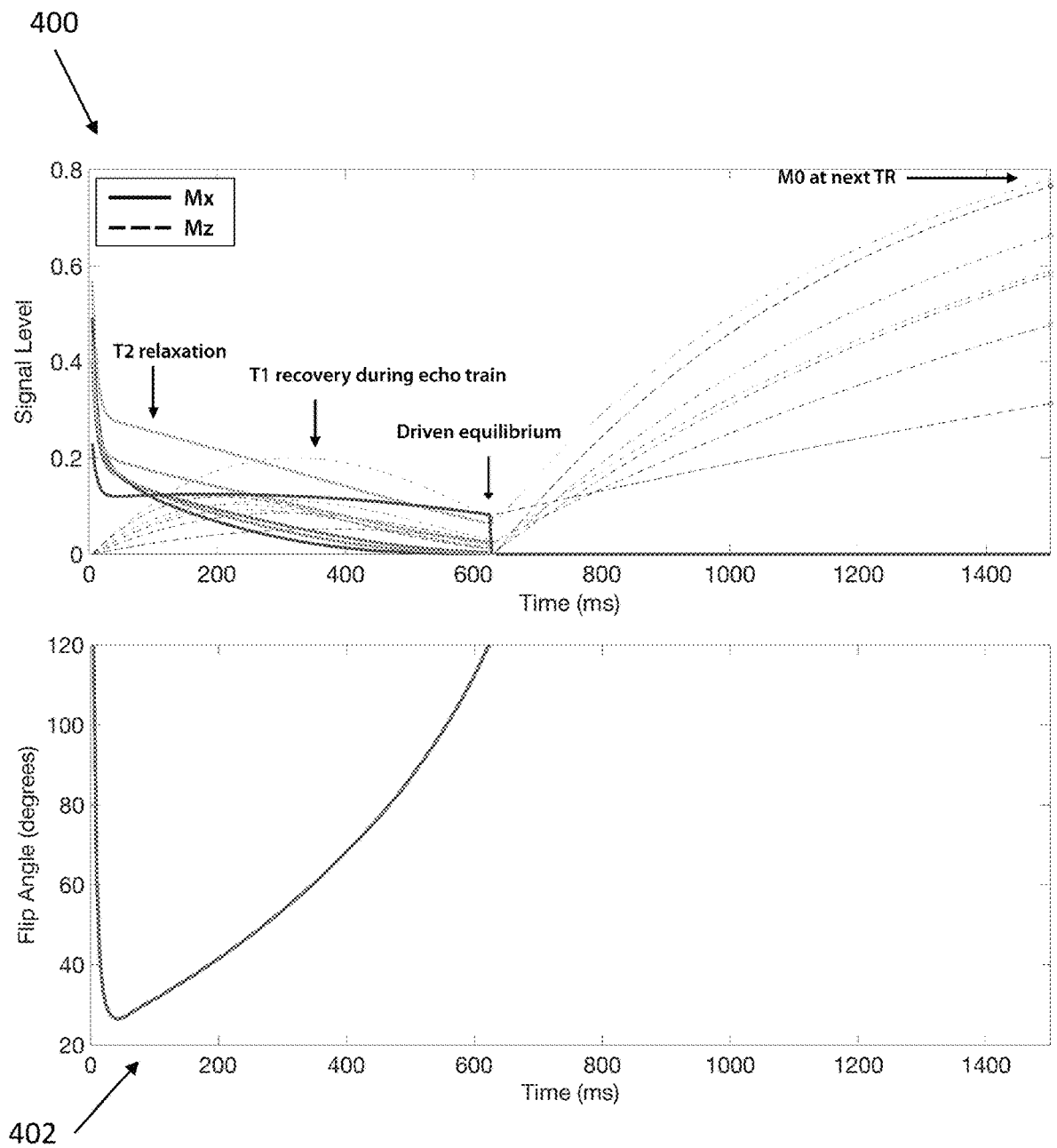
FIG. 4 shows graphs showing the volumetric fast spin-echo signal evolution with driven-equilibrium at the $i^{th}$ MRI echo time (TE) and $j^{th}$ MRI repetition time (TR), for different combinations of (T1, T2) obtained by an MRI system having one or more features consistent with the present description.

FIG. 4 shows graphs 400 and 402 showing the theoretical fast spin-echo signal evolution with driven-equilibrium and varying radio frequency refocusing pulse flip angles for MRI echo train length (ETL) of 134, MRI repetition time (TR) of 1500 ms, and for different combinations of (T1, T2) obtained by an MRI system having one or more features consistent with the present description. Graph 400 shows simulated steady-state transverse and longitudinal magnetization signal evolution curves for volumetric fast spin-echo MRI scanning with driven equilibrium across an MRI resonance time (TR) of 1500 ms using variable refocusing flip angles shown in graph 402. The flip angle defines the MRI radio frequency refocusing pulse amplitude and duration. The curves shown in graph 400 are given by:

$$S(TE_i, TR_j) = M_0 f(T_1, T_2, TE_i) \frac{1 - E_1(TR_j)}{1 - E_1(TR_j) f(T_1, T_2, TE_T)},$$

where $f(T_1, T_2, TE_i)$ is the relaxation signal at the $i^{th}$ TE, $$E_1(TR_j) = e^{-\frac{TR_j - T \times T_s}{T_1}},$$

$T_s$ is the echo spacing, and T is the echo train length (ETL). The relaxation signal $f(T_1, T_2, TE_i)$ depends on the variable refocusing flip angle scheme, shown in graph 402, and is calculated with the extended phase graph algorithm (EPG).

An ensemble of signal evolutions with (T1, T2) distribution matching the target sample can be simulated at each MRI echo time (TE) and MRI repetition time (TR) according to $S(TE_i, TR_j)$, using the extended phase graph algorithm (EPG). In some variations, the (T1, T2) distribution for a given target can be produced through conventional T1 and T2 mapping procedures. In other variations, the (T1, T2) distribution for a given target can be obtained from typical values of a target for a given population of samples. Such typical values may be obtained from prior measurements. (T1, T2) represents the longitudinal relaxation time (T1) and the transverse relaxation time (T2) of the atomic nuclei in a given voxel of the MRI data. A voxel being a unit of graphic information that defines a point in three-dimensional space. A voxel is similar to a pixel, but with a third dimension.

Signal evolutions observed in fast spin-echo MRI scans are functions of sample parameters ($T_1$, $T_2$) and the flip angles used for the radio frequency refocusing pulses in the echo train. The flip angle defines the MRI radio frequency refocusing pulse amplitude and duration. It is the angle to which the net magnetization is rotated, or tipped, relative to the main magnetic field direction in response to application of a radio frequency pulse at the Larmor frequency. The radio frequency power of the pulse is proportional to the angle through which the spins are tilted. Radio frequency field inhomogeneity can also influence the signal evolution.

Using the sample parameters (T1, T2) and the flip angles in the echo train, signal evolutions can be simulated. In some variations, signal evolutions can be generated using Bloch simulation, the extended pulse graph (EPG) algorithm, or the like.

Figure 5:
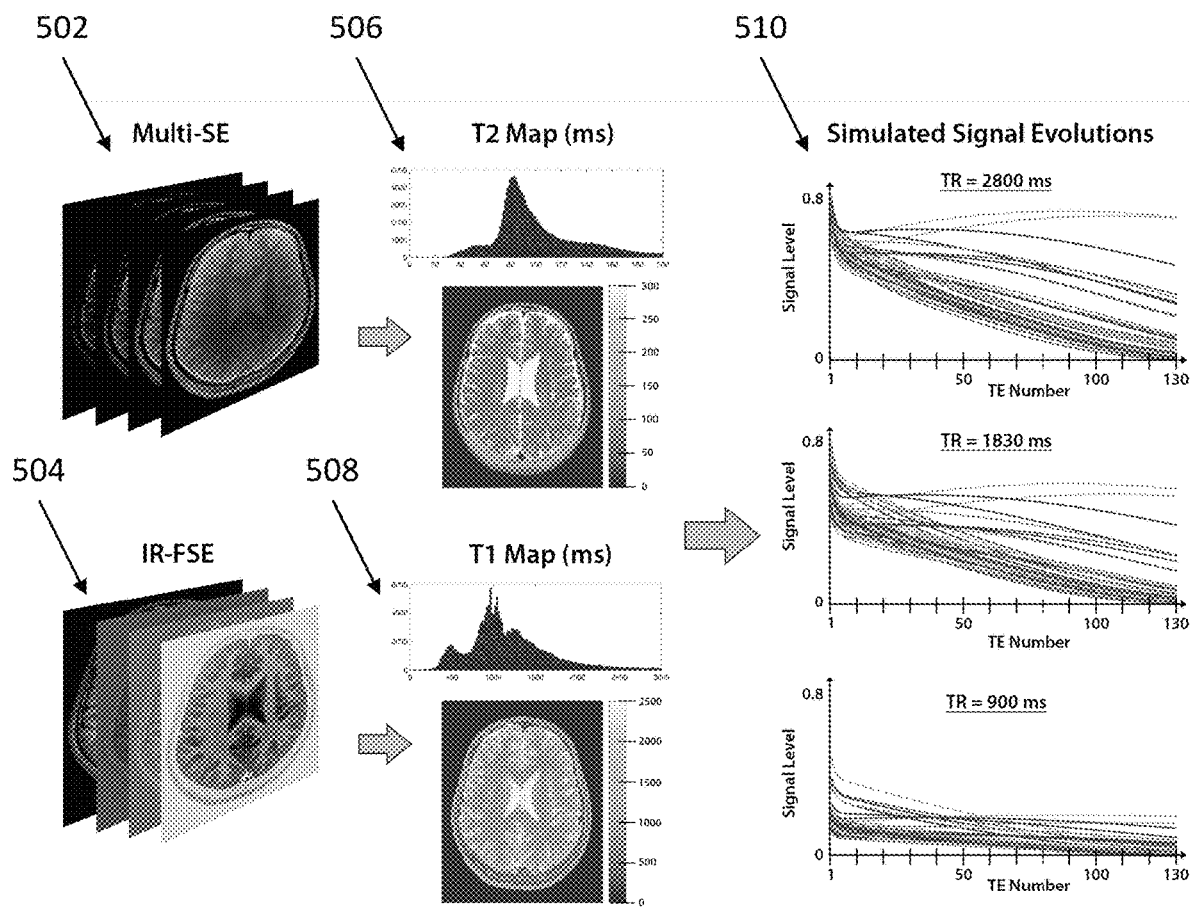
FIG. 5 shows T1 and T2 maps derived from conventional multi spin-echo MRI acquisition and inversion recovery volumetric fast spin-echo MRI acquisition using an MRI system having one or more features consistent with the present description.

FIG. 5 shows T1 and T2 maps derived from conventional multi spin-echo MRI acquisition and inversion recovery fast spin-echo MRI acquisition using an MRI system having one or more features consistent with the present description. MR image set 502 illustrates fully sampled MR images of a sample target obtained from conventional multi spin-echo MRI acquisition. MR image set 504 illustrates fully sampled MR images of the sample target obtained from inversion recovery fast spin-echo MRI acquisition. MR image set 502 can be used to estimate a T2 map 506 of the sample target and MR image set 504 can be used to estimate a T1 map 508 of the sample target. The T2 map 506 and T1 map 508 can be used to derive a T1-T2 distribution and simulate an ensemble of signal evolutions 510 with variable refocusing flip angles and variable MRI repetition times (TR).

A subspace approach can be used to remove noise artifacts from the MR images. To form a subspace, the signal evolutions, $S(TE_i, TR_j)$, at each MRI repetition time (TR) value can be concatenated into a single temporal curve. As used herein, the subspace may be referred to as the basis. The ensemble of signal evolutions can be denoted as:

$$X = [x_1 \ldots x_n]$$

where $x_n \in \mathbb{C}^{RT}$ is the $n^{th}$ simulated signal evolution. Here, T, is the echo time length (ETL) and R is the number of unique MRI repetition times (TRs). Here, $\mathbb{C}^m$ represents the space of complex-valued vectors of length m. A temporal subspace $\Phi_K \in \mathbb{C}^{RT \times K}$ can be computed through singular value decomposition (SVD) by taking the first K left principal vectors. Singular value decomposition is a factorization of a real or complex matrix. It is the generalization of the eigen-decomposition of a positive semidefinite normal matrix (for example, a symmetric matrix with positive eigenvalues) to any m×n matrix via an extension of polar decomposition. When computing a temporal subspace $\Phi_K \in \mathbb{C}^{RT \times K}$, it can be assumed that the signal evolutions belong to the subspace, for example:

$$X = \Phi_K \Phi_K^H X.$$

Here, $A^H$ represents the conjugate transpose operation of the matrix A.

The temporal coefficients of a signal evolution, x, are given by:

$$\alpha = \Phi_K^H x.$$

The temporal coefficients encode T1 and T2 sensitivity. The temporal coefficients can be linearly combined to form a target image contrast. The linear combination can be found by fitting the temporal coefficients of the ensemble of simulated signal evolutions to a simulated image contrast:

$$\min_c \sum_{n=1}^{N} (g_n(T_1, T_2) - c^H \alpha_n)^2,$$

where $c \in \mathbb{C}^K$ is a vector of weights for the linear combination $\alpha_n \in \mathbb{C}^K$ are the temporal coefficients of the $n^{th}$ simulated signal evolution, and $g_n$ is a target image contrast. For example, a spin-echo contrast with a prescribed MRI echo time (TE) and a prescribed MRI repetition time (TR) can be simulated through:

$$g_n(T_1, T_2) = \exp\left(-\frac{TE}{T_2}\right)\left(1 - \exp\left(-\frac{(TR - TE)}{T_1}\right)\right).$$

A subspace can be computed for each MRI protocol of interest. For example, a subspace can be pre-computed for each MRI protocol associated with obtaining MR images of a knee, a foot, a brain, or the like.

Figure 6:
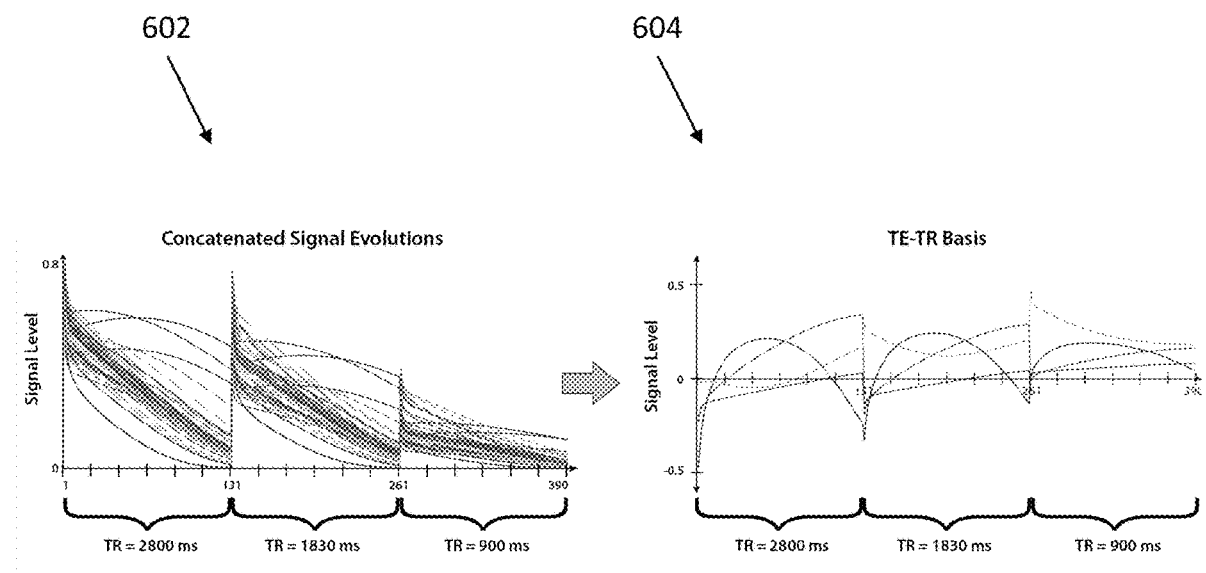
FIG. 6 shows a graph of concatenated signal evolutions at multiple MRI repetition times (TRs) and a graph showing the subspace formed through singular value decomposition at the multiple MRI repetition times (TRs) using one or more features consistent with the present description.

FIG. 6 shows a graph 602 of concatenated signal evolutions at multiple MRI repetition times (TRs) and graph 604 shows the subspace formed through singular value decomposition at the multiple MRI repetition times (TRs) using one or more features consistent with the present description. The graph 602 shows temporal curves for each of the MRI repetition times (TRs) shown.

Figure 7:
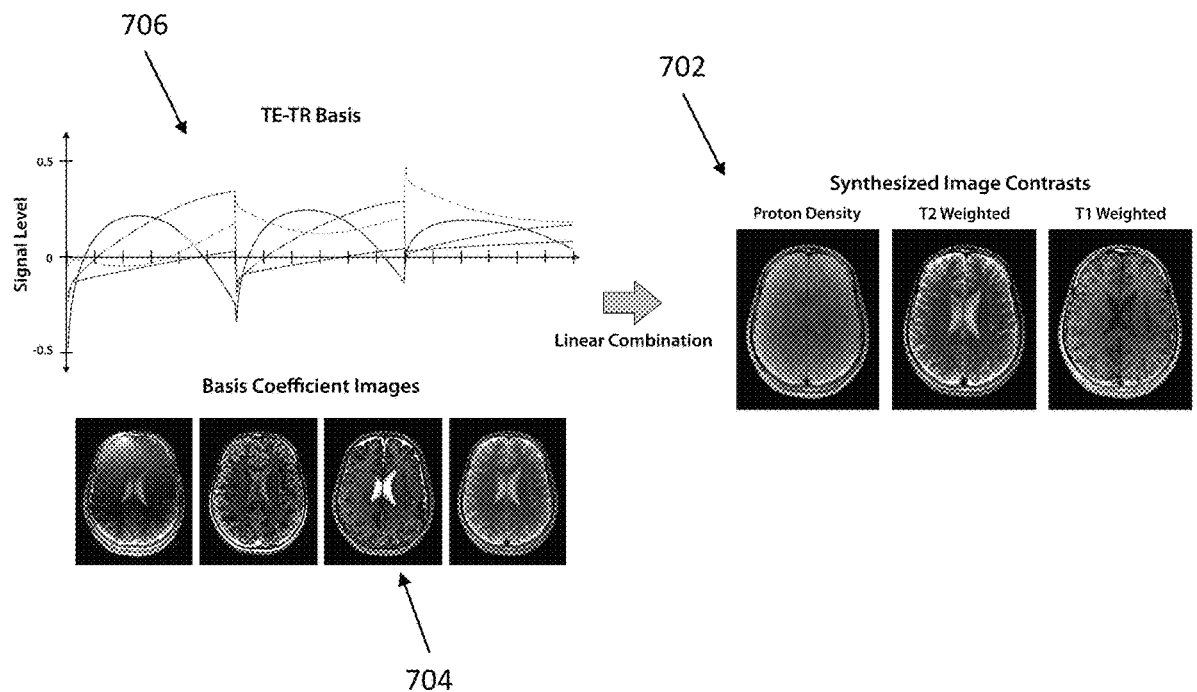
FIG. 7 shows arbitrary image contrasts generated from the subspace using one or more features consistent with the present description.

FIG. 7 shows arbitrary image contrasts 702 generated by linearly combining the subspace images using one or more features consistent with the present description. Arbitrary image contrasts 702 can be generated for different MRI anatomy protocols. For example, in FIG. 7, proton-density, T2-weighted, and T1-weighted image contrasts 702 have been generated for a brain of a human subject. The arbitrary image contrasts 702 can be generated by finding a linear combination based on the simulated T1 and T2 values and the pre-computed subspace.

The MRI data representing multiple MRI echo times (TEs) and MRI repetition times (TRs) can be reconstructed into subspace coefficient images. Conventional reconstruction techniques neglect echo train time progression between acquired phase encodes and produce a single image. Due to signals emitted by excited nuclei decay during the echo train, blurring artifacts can corrupt the final MR image, leading to a loss in apparent resolution. The presently described subject matter provides for reconstruction of the MRI data to form MR images by combining parallel imaging techniques and compressed sensing techniques. In some variations, the degrees of freedom in the presently described reconstruction techniques are reduced to increase efficiency.

For reconstruction, the data can be represented at each acquired MRI echo time (TE) and MRI repetition time (TR) by a forward model. In a forward model, the system model parameters are known and the image target is to be estimated. The forward model can be used to simulate the magnetic field that would result in the obtained MRI data. The reconstruction can solve an iterative inverse problem, where data consistency is enforced between the MRI scan data and the forward model until the MRI data converge. The reconstruction can also use compressed sensing-based regularization.

The forward model can be provided as:

$$y = PFSx,$$

where x is the complex-valued signal evolution at each image voxel, S are the MRI detector sensitivity maps, F is the Fourier transform operating on each MRI repetition time (TR) and MRI echo time (TE) image, P is the sampling operator that selects the acquired k-space samples at each MRI echo time (TE) and MRI repetition time (TR), and y is the acquired complex-valued data. The forward model can be relaxed with a temporal subspace constraint. Such a temporal subspace constraint can constrain the temporal signal evolution to a low-dimensional subspace. The reconstruction can then be formulated as:

$$\min_\alpha \frac{1}{2} \|y - PF\Phi_K \alpha\|_2^2 + \lambda \sum_r \|R_r(\alpha)\|_*,$$

where $\alpha$ are the complex-valued temporal image coefficients.

Locally low rank regularization can be applied to the temporal image coefficients to reduce the number of degrees of freedom. After reconstruction, the temporal coefficient images can be linearly combined, by fitting the temporal coefficients of the ensemble of simulated signal evolutions to a simulated image contrast, to form the desired clinical volumetric image contrasts.

Figure 8:
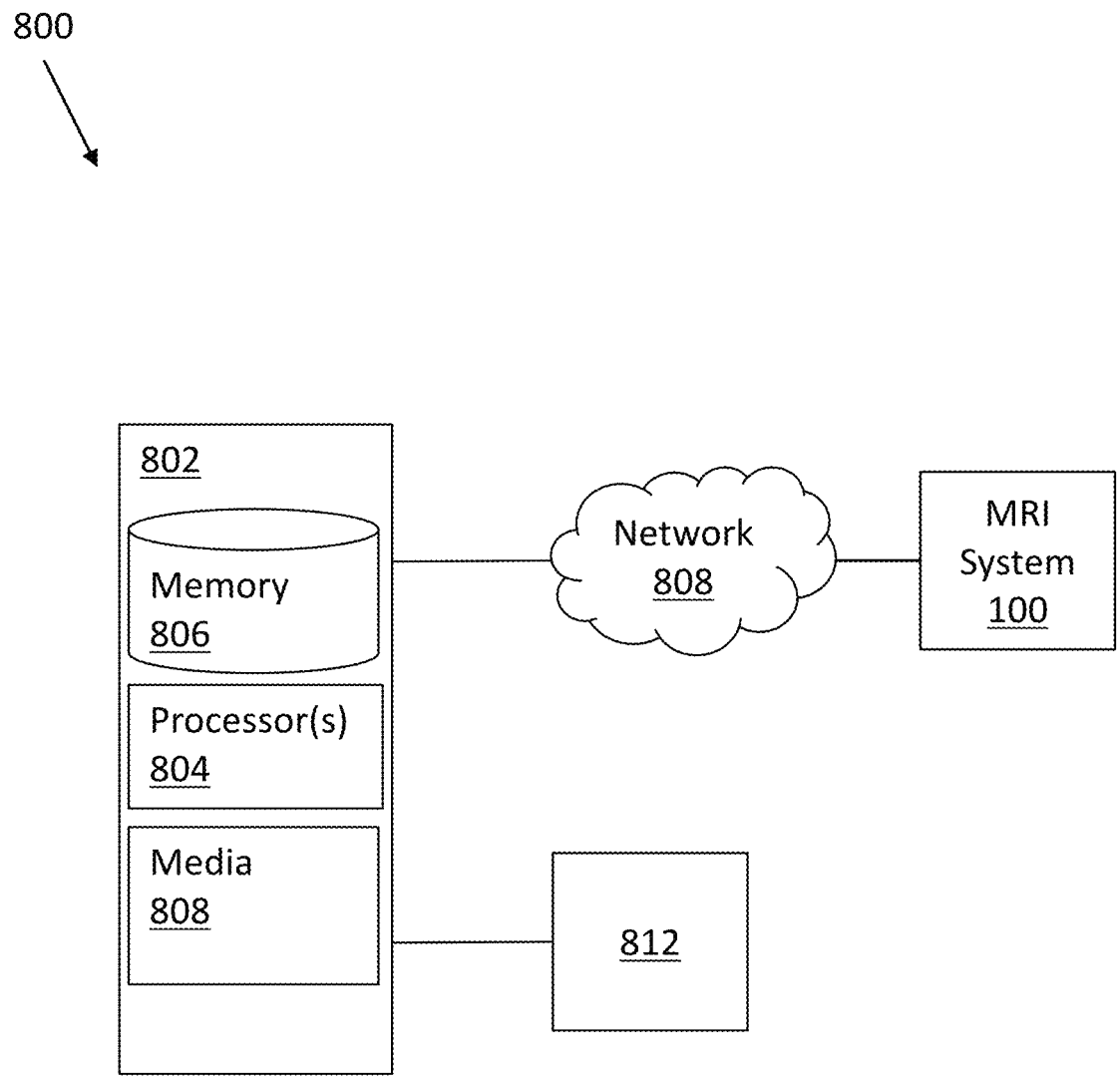
FIG. 8 illustrates a system having one or more features consistent with the present description.

FIG. 8 illustrates a system 800 having one or more features consistent with the present description. The computer system 802 can include one or more processors 804, memory 806, removable media 808, or the like. The computer system 802 can include communication lines, or ports to enable the exchange of information with a network 810 and/or other computing platforms 812. Illustration of computer system 802 in FIG. 8 is not intended to be limiting. The computer system 802 may include a plurality of hardware, software, and/or firmware components operating together to provide the functionality attributed herein to computer system 802. For example, the computer system 802 can be implemented by a plurality of computer systems and/or as a cloud of computing platforms operating together as computing system 802.

Processor(s) 804 can be configured to provide information processing capabilities in the computing system 802. As such, processor(s) 804 can include one or more of a digital processor, an analog processor, a digital circuit designed to process information, an analog circuit designed to process information, a state machine, and/or other mechanisms for electronically processing information. Although the processor(s) 804 is shown in FIG. 8 as a single entity, this is for illustrative purposes only. In some implementations, processor(s) 804 can include a plurality of processing units. These processing units may be physically located within the same device, or processor(s) 804 can represent processing functionality of a plurality of devices operating in coordination.

In some variations, the computing system 802 can be configured to communicate with the MRI system 100. The computing system 802 can be part of the MRI system 100. For example, the functionality attributed to the computing system 802 can be performed by the controller 106 of the MRI system 100, illustrated in FIG. 1, and vice versa.

In some variations, the controller 106, illustrated in FIG. 1 can be configured to control the acquisition of MRI data. The computing system 802 can be configured to facilitate the reconstruction of the MRI data into MR images.

Figure 9:
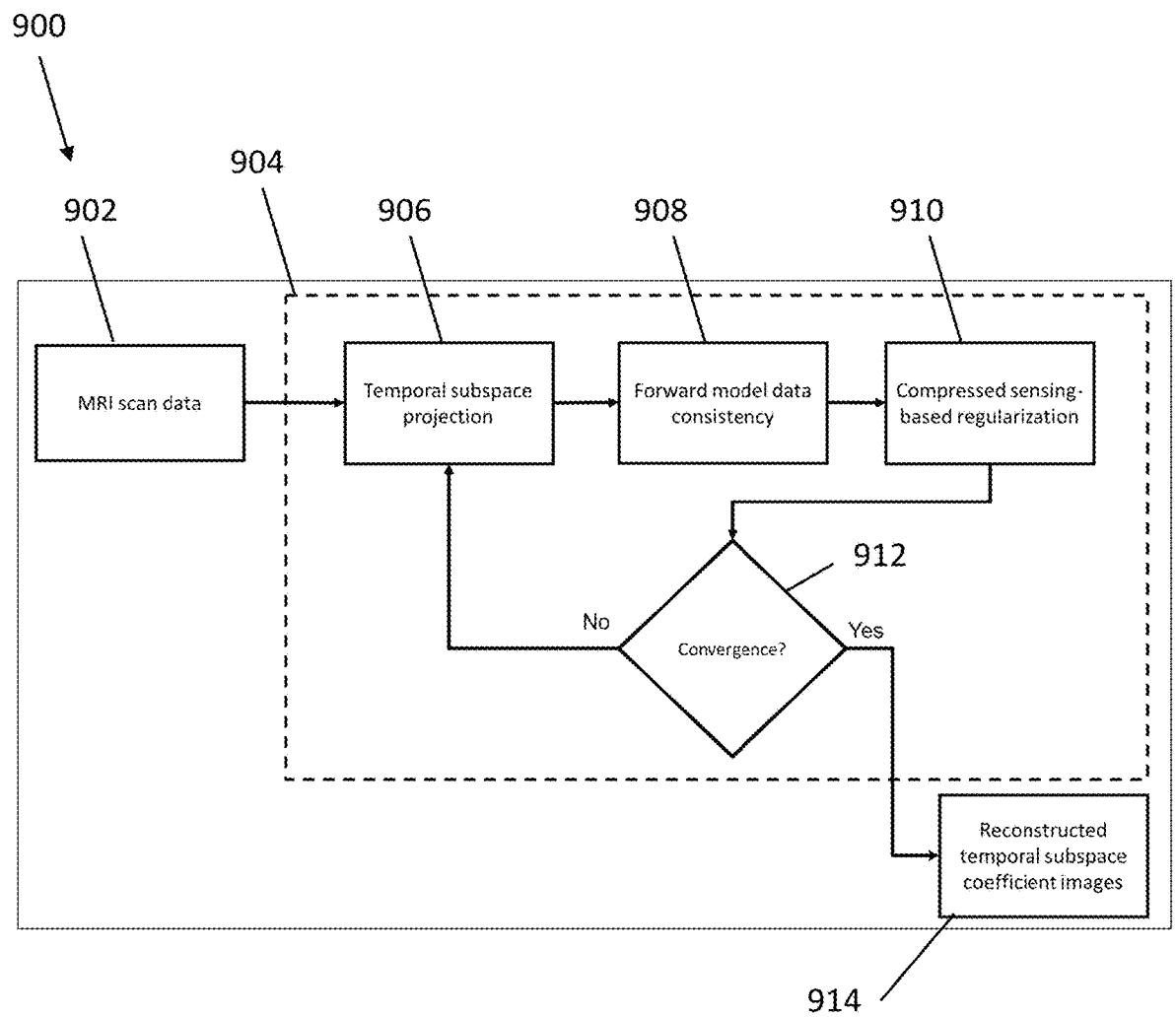
FIG. 9 shows a process flow for an iterative inverse problem reconstruction for use in a process having one or more features consistent with the present description.

FIG. 9 shows the process flow 900 for an algorithm that can solve the iterative inverse problem. The process flow can be performed by a computing system, such as computing system 800 illustrated in FIG. 8. Each iteration of the process can consist of, at least, a temporal subspace projection 906, forward model data consistency 908, and/or a compressed sensing-based regularization 910. At 902 MRI scan data can be obtained. The MRI scan data can be obtained from an MRI scanning system, such as MRI scanning system 100 illustrated in FIG. 1. The MRI scanning system can be a volumetric fast spin-echo MRI scanning system. The MRI scan data can include volumetric fast spin-echo MRI scan data. An iterative process 904 can be performed by a computing system to reconstruct temporal subspace coefficient images.

At 906, a temporal subspace projection can be generated. The temporal subspace projection can be generated through singular value decomposition (SVD), as described herein.

At 908, forward model data consistency can be performed using a known model for the target sample. In a forward model, the system model parameters are known and the image target is to be estimated. The forward model can be used to simulate the magnetic field that would result in the obtained MRI data. The reconstruction can solve an iterative inverse problem, where data consistency is enforced between the MRI scan data and the forward model until the MRI data converge.

At 910, compressed sensing-based regularization can be performed on the MRI scan data provided at 902. The compressed sensing-based regularization results in the recovery of signal dynamics of the MRI data at any virtual echo time during the echo train of the MRI scan data. Compressed sensing is a signal processing technique for efficiently acquiring and reconstructing a signal. Compresses sensing requires the finding of solutions to undetermined linear systems. Through optimization, the sparsity of a signal can be exploited to recover the signal from fewer samples than would be required using other techniques.

At 912, a determination of whether there is convergence between the recovered signal dynamics and the forward model. In response to determining there is no convergence the iterative process 904 is restarted.

At 914, in response to determining that there is convergence between the recovered signal dynamics and the forward model, the temporal subspace coefficient images of the MRI data are reconstructed. Every repetition of the iteration process 904 refines the estimate for the image coefficients through temporal subspace projection, forward model data consistency, and compressed sensing-based regularization. At convergence, the temporal coefficient images are fully reconstructed.

Referring to FIG. 5, T2 map 506 and T1 map 508 have been generated from an MRI scan using a three Tesla (3T) MRI scanning system. The MRI scan used conventional two dimensional multi spin-echo and inversion recovery fast spin-echo scanning. In the illustrated example, an ensemble of N=10240 signal evolutions was chosen from the T1-T2 distribution and three MRI repetition time (TR) values were simulated (2800 ms, 1830 ms, and 900 ms). A basis of size K=4 was constructed with singular value decomposition, as shown in FIG. 5. The linear combinations for each desired image contrast were computed from the ensemble by fitting the temporal coefficients of the ensemble of simulated signal evolutions to a simulated image contrast, as shown by:

$$\min_c \sum_{n=1}^{N} (g_n(T_1, T_2) - c^H \alpha_n)^2,$$

Referring to FIG. 7, shown is the process for forming proton-density, T2-weighted, and T1-weighted images of the brain by linearly combining the subspace signal values. Synthesized proton-density, T2-weighted and T1-weighted images can be generated from the MRI scan data and the pre-computed subspace. The proton-density, T2-weighted and T1-weighted images can be synthesized representing arbitrary scan parameters.

Figure 10:
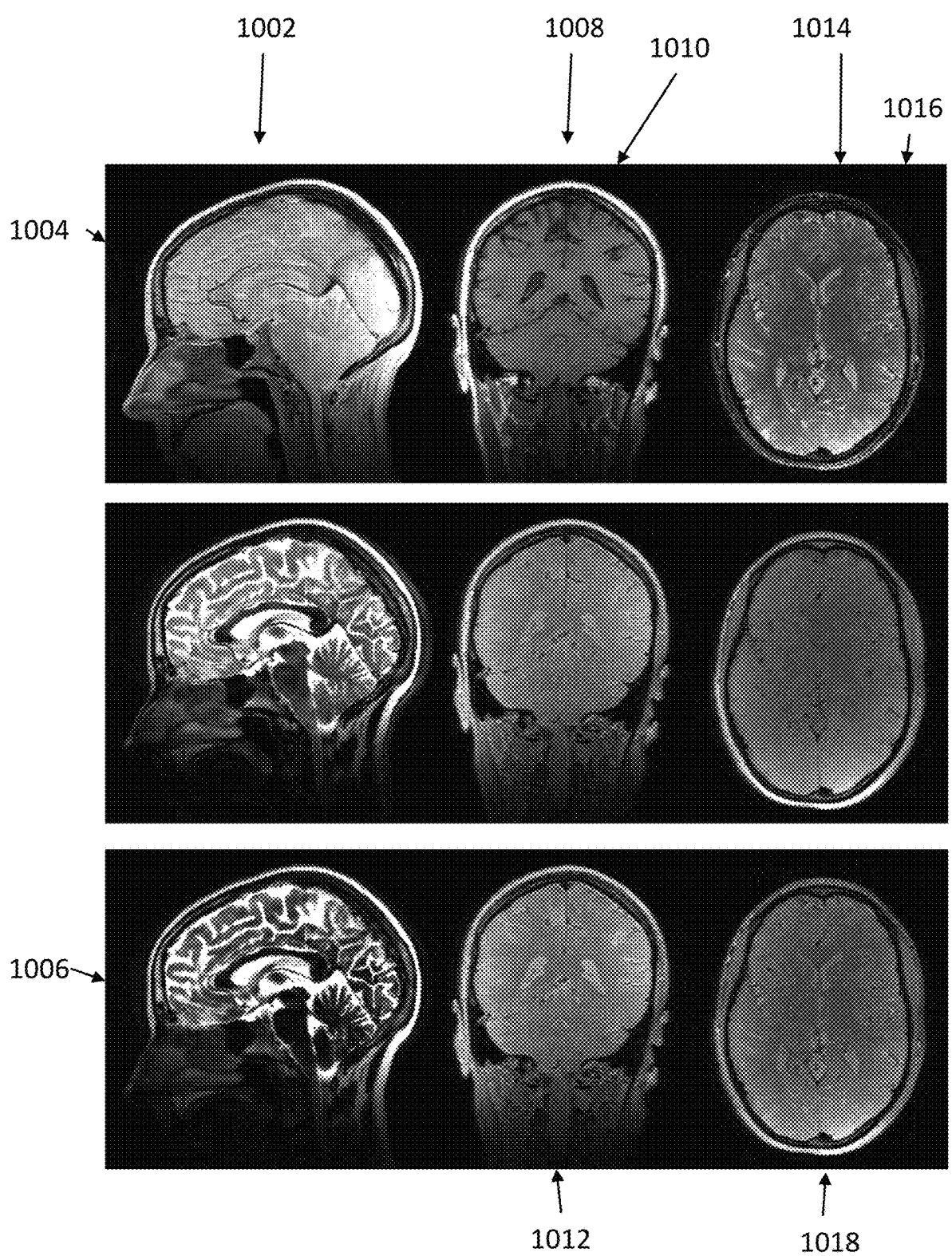
FIG. 10 shows examples of reconstructed images of MRI data that has a variable MRI repetition time (TR) and random sampling patterns, obtained using a process having one or more features consistent with the present description.

FIG. 10 shows examples of reconstructed images of MRI data that has variable MRI repetition time (TR) and random sampling patterns, using a process having one or more features consistent with the present description. The MRI data having been processed to linearly combine the temporal subspace image coefficients.

The images in the left-hand column 1002 show sagittal reformats of generated MRI image contrasts at an MRI repetition time (TR) of 7000 ms and an MRI echo time (TE) increasing from 5 ms, at image 1004, to 200 ms, at image 1006. The images in the middle column 1008 show coronal reformats of generated MRI saturation recovery images at an MRI echo time (TE) of 10 ms and an MRI repetition time (TR) increasing from 200 ms, at image 1010, to 700 ms, at image 1012. The images in the right column 1014 show axial reformats of generated MRI inversion recovery images with an MRI echo time (TE) of 10 ms, an MRI repetition time (TR) of 7000 ms, and with MRI inversion time (TI) increasing from 50 ms, at image 1016, to 7000 ms, at image 1018.

Figure 11:
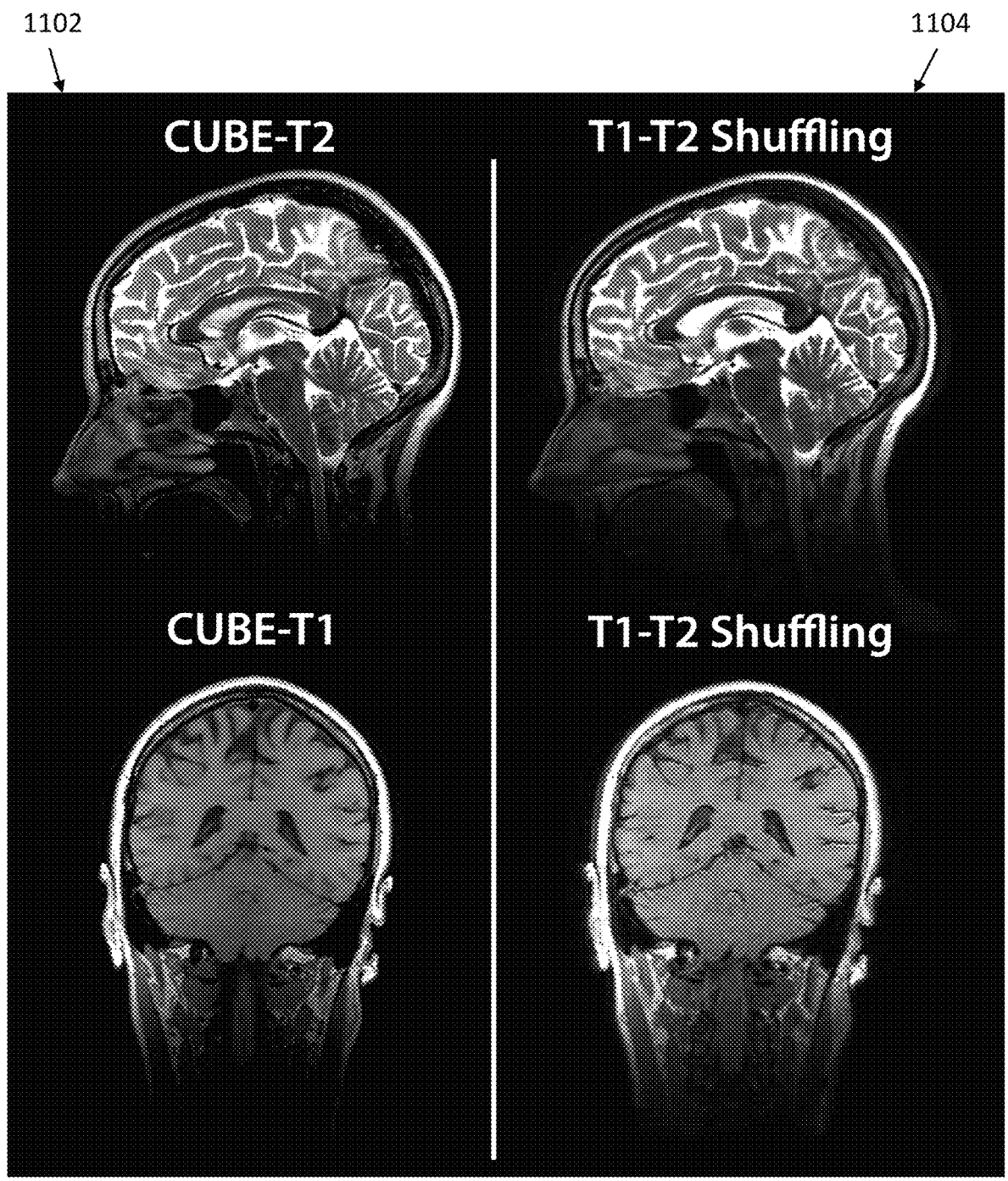
FIG. 11 shows a comparison between conventional T1-weighted and T2-weighted images obtained from two separate MRI scan acquisitions and the equivalent synthesized image contrasts obtained from a single acquisition using a process having one or more features consistent with the present description.

FIG. 11 shows a comparison between conventional T1-weighted and T2-weighted images obtained from two separate MRI scan acquisitions and the equivalent synthesized image contrasts obtained during a single acquisition, using a process having one or more features consistent with the present description. In some example embodiments, a process having one or more features consistent with the present description can be referred to as T1-T2 Shuffling. The MR images in column 1102 represent MR images obtained using a conventional volumetric fast spin-echo (3D FSE) MRI scanning protocol. The MR images in column 1104 represent MR images obtained using an MRI scanning protocol having or more features consistent with the present description.

A non-limiting benefit of the presently described subject matter include providing clinically viable volumetric fast spin-echo imaging at several clinical image contrasts obtained using a single MRI scan. The images obtained using one or more features of the presently described subject matter have reduced blurring compared to conventional volumetric fast spin-echo techniques because the signal decay is accounted for in the reconstruction. The combination can lead to a shorter overall exam time for conventional proton-density, T1-weighted, and T2-weighted exams.

The presently described MRI scanning protocol can use a single MRI scan to acquire whole volumes with multiple contrasts, which can be formatted in arbitrary planes with isotropic resolution. The presently described MRI scanning protocol is well-suited for exams demanding isotropic T1 and T2 weighted images, such as neuro-imaging.

Figure 12:
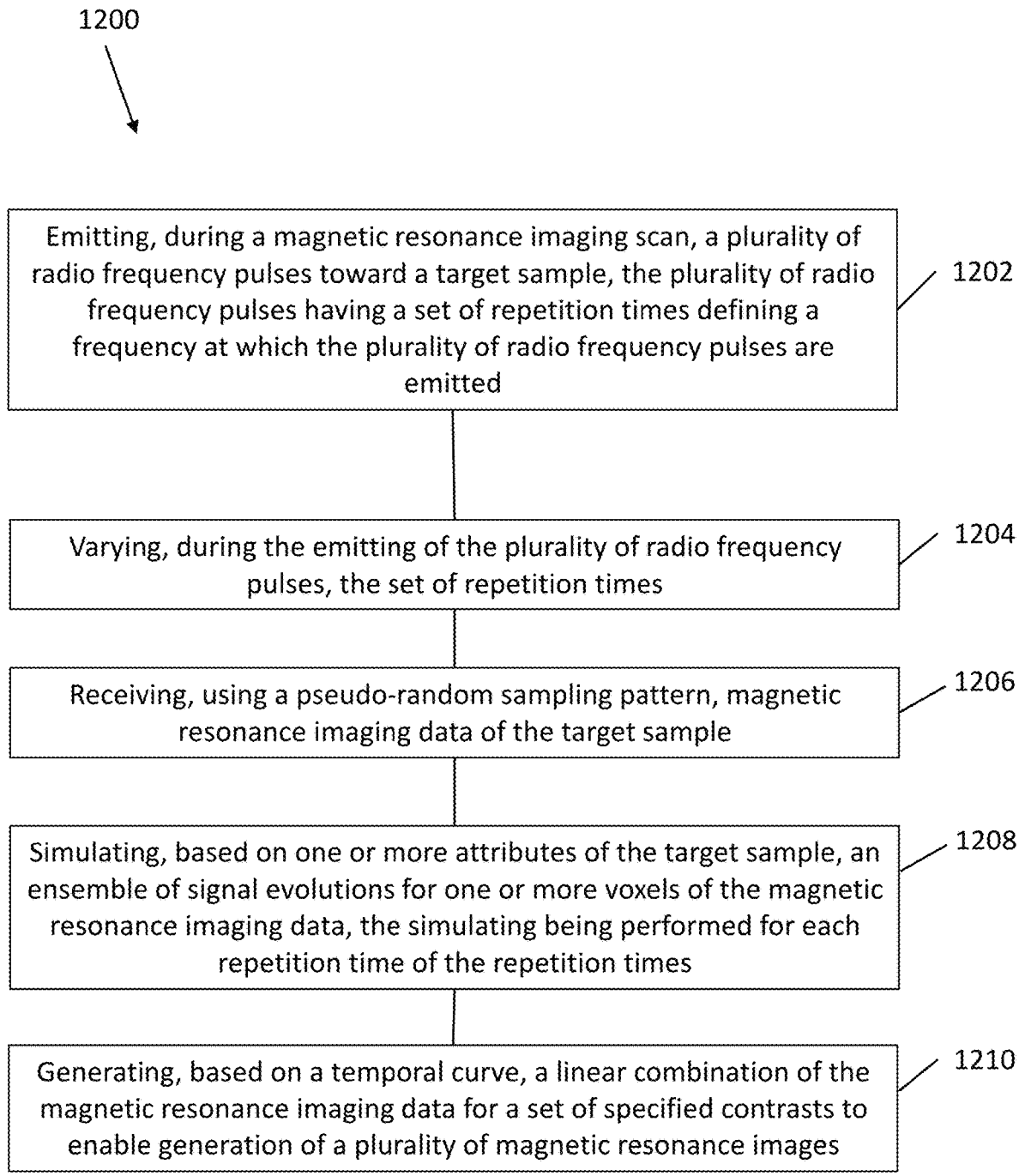
FIG. 12 shows a process flow having one or more features consistent with the present description.

FIG. 12 illustrates a process 1200 having one or more features consistent with the present description.

At 1202, a plurality of radio frequency pulses can be emitted. The radio frequency pulses can be emitted by an MRI system, for example MRI system 100 illustrated in FIG. 1. The radio frequency pulses can be emitted by the magnet system 102. In some variations, the plurality of radio frequency pulses can be emitted by a transmitter. The transmitter can be at least a component of a waveguide. The plurality of radio frequency pulses can be directed toward a target sample. The plurality of radio frequency pulses can have a set of repetition times. The set of repetition times can define a frequency at which the plurality of radio frequency pulses are emitted. In some variations, the magnetic resonance imaging scan is a volumetric fast spin-echo magnetic resonance imaging scan.

At 1204, the set of repetition times can be varied. The set of repetition times can be varied by an MRI system, for example MRI system 100 illustrated in FIG. 1. In some variations, the set of repetition times can be varied by a controller, such as controller 106 illustrated in FIG. 1. The set of repetition times can be varied during the emitting of the plurality of the radio frequency pulses. The set of repetitions can be varied. The set of repetition times can be varied by having a specified set of lengths of the set of repetition times. A fraction of a total scan time of the magnetic resonance imaging scan can be specified for each of the repetition times.

The repetition times can be varied by specifying a set of lengths for the repetition times. The varying, during an MRI scan, of the repetition times can follow the specified set of lengths. The order of the different repetition time lengths can also be specified. The repetition times can be pre-optimized based on a pattern of repetition times. The pattern can be associated with one or more attributes of the target sample. For example, the pattern of repetition times for a brain can be different from the pattern of repetition times for a musculoskeletal system. In some variations, the repetition times can be pseudo-randomly varied.

At 1206, magnetic resonance imaging data of a target sample can be received. The magnetic resonance imaging data of the target sample can be received by an MRI system, such as MRI system 100 illustrated in FIG. 1. In some variations, the magnetic resonance imaging data can be received by a receiver. The receiver can be at least a component of a waveguide. A pseudo-random sampling pattern can be used to facilitate the receiving of the magnetic resonance imaging data. The plurality of magnetic resonance images can be obtained from a single magnetic resonance imaging scan. In some variations, the set of specified contrasts include at least two contrasts.

At 1208, an ensemble of signal evolutions for one or more voxels of the magnetic resonance imaging data can be simulated. The simulating can be performed by one or more processors executing instructions stored on memory, for example processor(s) 804 and memory 806, illustrated in FIG. 8. The simulating can be performed for each repetition time of the repetition times. The simulating of the ensemble of signal evolutions for the one or more voxels can include simulating, for one or more repetition times of the set of repetition times, the ensemble of signal evolutions for a set of radio frequency refocusing pulses.

At 1210, a linear combination of the magnetic resonance imaging data can be generated for a set of specified contrasts. The generating can be performed by one or more processors executing instructions stored on memory, for example processor(s) 804 and memory 806, illustrated in FIG. 8. The linear combinations can enable generation of a plurality of magnetic resonance images.

Figure 13:
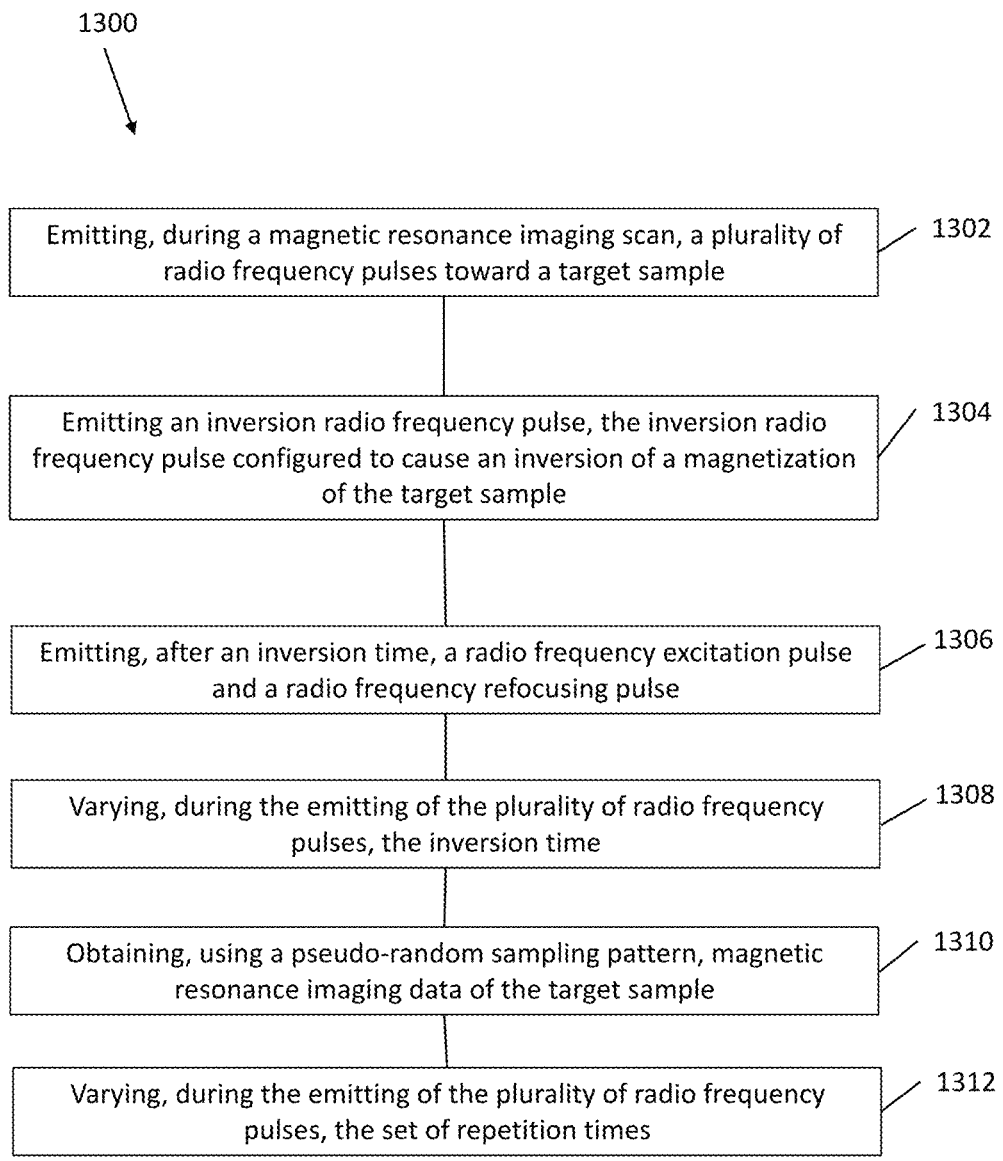
FIG. 13 shows a process flow having one or more features consistent with the present description.

FIG. 13 illustrates a process 1300 having one or more features consistent with the present description.

At 1302, a plurality of radio frequency pulses can be emitted. The plurality of radio frequency pulses can be directed toward a target sample. The radio frequency pulses can be emitted by an MRI system, for example MRI system 100 illustrated in FIG. 1. The radio frequency pulses can be emitted by the magnet system 102. In some variations, plurality of radio frequency pulses can be emitted by a transmitter. The transmitter can be part of an MRI system, such MRI system 100.

At 1304, an inversion radio frequency pulse can be emitted. The inversion radio frequency pulse can be configured to cause an inversion of a magnetization of the target sample. The inversion radio frequency pulse can be emitted by an MRI system, for example MRI system 100 illustrated in FIG. 1. The inversion radio frequency pulse can be emitted by the magnet system 102. In some variations, the inversion radio frequency pulse can be emitted by a transmitter. The transmitter can be part of an MRI system, such MRI system 100.

At 1306, a radio frequency excitation pulse and a radio frequency refocusing pulse can be emitted. The radio frequency excitation pulse and radio frequency refocusing pulse can be emitted after an inversion time. The radio frequency excitation pulse and the radio frequency refocusing pulse can be emitted by an MRI system, for example MRI system 100 illustrated in FIG. 1. The radio frequency excitation pulse and the radio frequency refocusing pulse can be emitted by the magnet system 102. In some variations, the radio frequency excitation pulse and the radio frequency refocusing pulse can be emitted by a transmitter. The transmitter can be part of an MRI system, such MRI system 100.

At 1308, the inversion time can be varied. The inversion time can be varied by an MRI system, for example MRI system 100 illustrated in FIG. 1. In some variations, the inversion time can be varied by a controller, such as controller 106 illustrated in FIG. 1. The inversion time can be varied during the emitting of the plurality of radio frequency pulses. The inversion times can be varied using one or more of the techniques described with respect to varying the repetition times. For example, inversion times can be varied pseudo-randomly, in accordance with a fixed pattern, or the like.

At 1310, a pseudo-random sampling pattern can be used to facilitate receipt of magnetic resonance imaging data of the target sample. The magnetic resonance imaging data of the target sample can be received by an MRI system, such as MRI system 100 illustrated in FIG. 1. In some variations, the magnetic resonance imaging data can be received by a receiver. The receiver can be at least a component of a waveguide. The pseudo-random sampling pattern can be implemented by a controller, such as controller 106 illustrated in FIG. 1.

At 1312, a set repetition times of the radio frequency pulses can be varied. The set of repetition times can be varied by an MRI system, for example MRI system 100 illustrated in FIG. 1. In some variations, the set of repetition times can be varied by a controller, such as controller 106 illustrated in FIG. 1. The repetition times can be varied in a similar manner to the inversion times. For example, the repetition times can be varied pseudo-randomly, in accordance with a fixed pattern, or the like.

The magnetic resonance imaging scan can be a volumetric fast spin-echo magnetic resonance imaging scan performed by a volumetric fast spin-echo magnetic resonance imaging scanner. The plurality of magnetic resonance images are obtained from a single magnetic resonance imaging scan. The set of inversion times can be varied by specifying a set of lengths of the set of repetition times. The specifying of the set of inversion times can be performed by a controller, such as controller 108. The varying of the inversion times can include varying the inversion times by a set of pre-optimized values in accordance with a pattern. The pattern can be specific to one or more features of the target sample. The inversion times can be pseudo-randomly varied.

An ensemble of signal evolutions for one or more voxels of the magnetic resonance imaging data can be simulated. The simulating can be performed by a computer system, such as computer system 800 illustrated in FIG. 8. The simulating can be performed for each of the inversion times. The simulating can be based on one or more attributes of the target sample.

A linear combination of the magnetic resonance imaging data can be generated for a set of specified contrasts to enable generation of a plurality of magnetic resonance images. The generating can be performed by computer system, such as computer system 800 illustrated in FIG. 8.

One or more aspects or features of the subject matter described herein can be realized by an MRI system, a controller associated with an MRI system, a computer system associated with the MRI system, a computer system remote from the MRI system, or the like. In some variations, one or more central processing units and/or one or more graphical processing units can be utilized to perform one or more of the features described herein.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;"

"one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system comprising:
a transmitter configured to at least emit a plurality of radio frequency pulses directed toward a target sample, the plurality of radio frequency pulses having a set of repetition times defining a frequency at which the plurality of radio frequency pulses are emitted;
a controller configured to at least vary, during the emitting of the plurality of radio frequency pulses, the set of repetition times;
a receiver configured to at least receive, in response to a pseudo-random sampling pattern, magnetic resonance signals generated by the target sample, wherein the controller is further configured to at least cause the transmitter and the receiver to perform a volumetric fast spin-echo magnetic resonance imaging scan;
one or more processors; and
memory storing instructions which, when executed by the one or more processors, cause the system to perform operations comprising:
simulating, by the one or more processors, an ensemble of signal evolutions for one or more voxels based on the magnetic resonance signals.

2. The system as in claim 1, wherein each repetition time of the set of repetition times comprise:
a set of lengths of time; and
a fraction of a total scan time of a magnetic resonance imaging scan performed by the system.

3. The system as in claim 1, wherein the set of repetition times comprises one or more repetition times having pre-optimized values in accordance with a pattern.

4. The system as in claim 1, wherein the set of repetition times are pseudo-randomly varied.

5. The system as in claim 1, wherein the simulating is based on one or more attributes of the target sample, and wherein the simulating is performed for each repetition time of the repetition times.

6. The system as in claim 1, wherein the ensemble of signal evolutions is simulated for a set of radio frequency refocusing pulses.

7. The system as in claim 1, wherein the operations further comprise:
generating, by the one or more processors and based on a temporal curve, a linear combination of the magnetic resonance signals for a set of specified contrasts to enable generation of a plurality of magnetic resonance images.

8. The system of claim 7, wherein the plurality of magnetic resonance images are obtained from a single magnetic resonance imaging scan.

9. The system as in claim 7, wherein the set of specified contrasts include at least two contrasts.

10. A method comprising:
emitting, during a magnetic resonance imaging scan, a plurality of radio frequency pulses directed toward a target sample, the plurality of radio frequency pulses having a set of repetition times defining a frequency at which the plurality of radio frequency pulses are emitted;
varying, during the emitting of the plurality of radio frequency pulses, the set of repetition times;
receiving, in response to a pseudo-random sampling pattern, magnetic resonance signals generated by the target sample, wherein the magnetic resonance imaging scan comprises a volumetric fast spin-echo magnetic resonance imaging scan; and
simulating an ensemble of signal evolutions for one or more voxels based on the magnetic resonance signals.

11. The method as in claim 10, wherein the varying of the set of repetition times comprises:
specifying a set of lengths of the set of repetition times;
specifying, for each repetition time, a fraction of a total scan time of the magnetic resonance imaging scan; and
wherein the emitting of the plurality of radio frequency pulses comprises emitting the plurality of radio frequency pulses in accordance with the specified set of lengths of the set of repetition times and the specified fraction of the total scan time for each of the repetition times.

12. The method as in claim 10, wherein the set of repetition times includes one or more repetition times having pre-optimized values in accordance with a pattern.

13. The method as in claim 10, wherein the varying of the set of repetition times comprises pseudo-randomly varying the set of repetition times.

14. The method as in claim 10,
wherein the simulating is based on one or more attributes of the target sample, and wherein the simulating is performed for each repetition time of the repetition times.

15. The method as in claim 10, further comprising:
generating, based on a temporal curve, a linear combination of the magnetic resonance signals for a set of specified contrasts to enable generation of a plurality of magnetic resonance images.

16. The method of claim 15, wherein the plurality of magnetic resonance images are obtained from a single magnetic resonance imaging scan.

17. A method comprising:
  emitting, during a magnetic resonance imaging scan, a plurality of radio frequency pulses directed toward a target sample, the emitting of the plurality of radio frequency pulses comprising:
    emitting an inversion radio frequency pulse, the inversion radio frequency pulse configured to cause an inversion of a magnetization of the target sample,
    emitting, after an inversion time, a radio frequency excitation pulse and a radio frequency refocusing pulse, and
    varying, during the emitting of the plurality of radio frequency pulses, the inversion time;
  receiving, in response to a pseudo-random sampling pattern, magnetic resonance signals generated by the target sample, wherein the magnetic resonance imaging scan comprises a volumetric fast spin-echo magnetic resonance imaging scan; and
  simulating an ensemble of signal evolutions for one or more voxels based on the magnetic resonance signals.

18. The method of claim 17, wherein the plurality of radio frequency pulses have a set of repetition times defining a frequency at which the plurality of radio frequency pulses are emitted, and the method further comprises:
  varying, during the emitting of the plurality of radio frequency pulses, the set of repetition times.

\* \* \* \* \*